United States Patent [19]
Kim et al.

[11] Patent Number: 5,751,917
[45] Date of Patent: May 12, 1998

[54] METHOD AND APPARATUS FOR CONTROLLING MOVEMENTS OF A CHIP MOUNTING ROBOT

[75] Inventors: Young Hyeon Kim; Pil Young Seong, both of Suwon, Rep. of Korea

[73] Assignee: Samsung Electronics Co., Ltd., Suwon, Rep. of Korea

[21] Appl. No.: 629,735

[22] Filed: Apr. 9, 1996

[30] Foreign Application Priority Data

Dec. 28, 1995 [KR] Rep. of Korea .................. 95-61664

[51] Int. Cl.⁶ .................................................. G06F 15/46
[52] U.S. Cl. .................................................. 395/89; 395/87
[58] Field of Search .................................. 395/89, 87

[56] References Cited

U.S. PATENT DOCUMENTS

| | | | |
|---|---|---|---|
| 4,305,130 | 12/1981 | Kelley et al. | 318/640 |
| 4,581,566 | 4/1986 | Ekstrom et al. | 395/89 |
| 4,707,647 | 11/1987 | Coldren et al. | 395/89 |
| 4,910,859 | 3/1990 | Holcomb | 29/564.2 |
| 4,989,191 | 1/1991 | Kuo | 369/33 |
| 5,265,195 | 11/1993 | Jinno et al. | 395/96 |
| 5,293,179 | 3/1994 | Ichikawa et al. | 346/140 R |

FOREIGN PATENT DOCUMENTS 5-6910  1/1993  Japan .

*Primary Examiner*—George B. Davis
*Attorney, Agent, or Firm*—Burns, Doane, Swecker & Mathis, L.L.P.

[57] ABSTRACT

A robot for mounting a chip on a printed circuit board includes a body movable along a forward/backward axis, and a chip-carrying head unit movable longitudinally along the body transversely of the forward/backward axis. Due to manufacturing tolerances the longitudinal axis of the body is slightly inclined relative to a leftward/rightward axis oriented perpendicular to the forward/backward axis by an error angle which can be measured. The head unit is intended to be positioned at target coordinates on the forward/backward axis and the leftward/rightward axis, respectively. An operation unit determines, as a function of the error angle, a position of the head unit relative to the body, and a position of the body relative to the forward/backward axis, which would place the head unit at the target coordinates. A controller connected to the operation unit actuates a drive mechanism for moving the head unit and body to those respective positions.

4 Claims, 2 Drawing Sheets

METHOD AND APPARATUS FOR CONTROLLING MOVEMENTS OF A CHIP MOUNTING ROBOT

BACKGROUND OF THE INVENTION

The present invention relates to a position control method and a position control apparatus for controlling a chip mounting performed by an orthogonal robot of a chip mounter.

A chip mounter is an apparatus for mounting a component on a printed circuit board, which requires a position control of a high speed and a high precision. For this purpose, a robot which is controlled by an orthogonal coordinate system is generally used.

The position of a head unit which contains a chip mounting nozzle cannot be accurately controlled by such an orthogonal robot, because a forward/backward moving axis and a leftward/rightward axis do not constitute a right angle accurately therebetween. That is, even a minute inaccuracy occurring when installing the forward/backward moving axis and the leftward/rightward moving axis of the orthogonal robot produces an error angle, and the head unit moves along the inaccurate moving axis. Thus, the head unit moves to a different position from an actual input position.

SUMMARY OF THE INVENTION

Therefore, to solve the above conventional problem, it is an object of the present invention to provide a position control method and a position control apparatus for controlling chip mounting of an orthogonal robot for a chip mounter, which corrects a distance error due to an error angle between a forward/backward axis and a leftward/rightward lateral axis to accurately position a head unit.

To accomplish the above object of the present invention, there is provided a position control method for controlling chip mounting of an orthogonal robot for a chip mounter including a head unit having a chip mounting nozzle, a leftward/rightward axis along which the head unit travels, at least one forward/backward axis upon which the leftward/rightward moving axis is moved forwards or backwards, the chip mounting position control method comprising the steps of:

obtaining an error angle of the forward/backward axis with respect to the direction perpendicular to the leftward/rightward axis, deciding a target position to move the head unit;

obtaining a corrected position by correcting an error value between the target position and an actual position of the head unit which is produced by the error angle the target position; and using the corrected position as a moving position of the head unit.

Here, the target position is given as a position value on the leftward/rightward moving axis and a position value on the forward/backward moving axis. The corrected position is obtained by a corrected position on the leftward/rightward moving axis and a corrected position on the forward/backward moving axis. Accordingly, the corrected position can be easily obtained by calculating the orthogonal coordinates.

Also, the corrected position on the leftward/rightward moving axis and the corrected position on the forward/backward moving axis can be simply calculated by the following equations (1) and (2).

$$X' = X / \cos\theta \quad (1)$$

$$Y' = Y - (X \cdot \tan\theta) \quad (2)$$

Here, X is a position value on the leftward/rightward axis of a target moving position, Y is a position value on the forward/backward axis of the target moving position, X' is a position value on the leftward/rightward moving axis of a corrected position, Y' is a position value on the forward/backward moving axis of the corrected position, and θ is an error angle on the leftward/rightward moving axis with respect to the forward/backward moving axis.

Also, according to the present invention, there is provided a position control apparatus for controlling chip mounting of an orthogonal robot for a chip mounter which can control an accurate position control by correcting an error due to an error angle in the same manner as the above method.

DETAILED DESCRIPTION OF THE PREFERRED EMBODIMENT

A preferred embodiment of the present invention will be described below in more detail with reference to the accompanying drawings.

Figure 1:
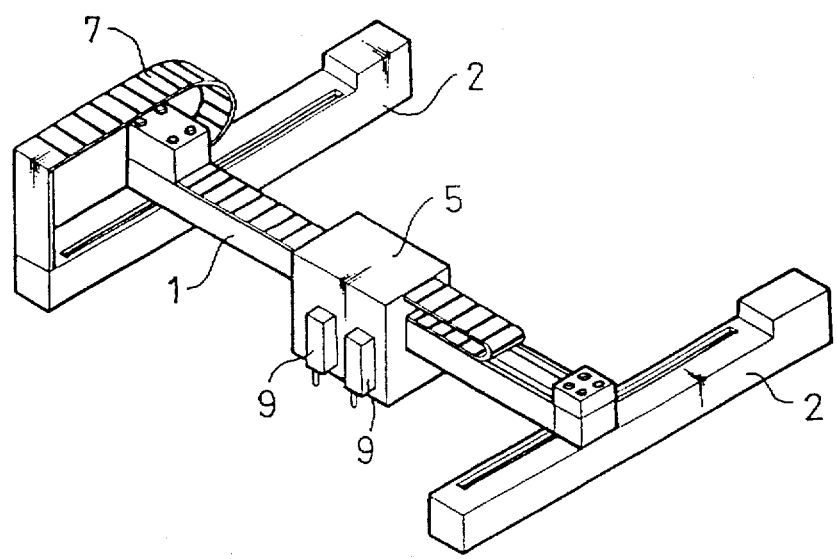
FIG. 1 is a perspective view of an orthogonal robot of a chip mounter.

As shown in FIG. 1, the chip mounting orthogonal robot includes a body 1A ideally lying on a leftward/rightward axis 1 which is referred to as a horizontal axis hereinafter, two bodies 2A defining forward/backward axes 2, and a head unit 5. Horizontal body 1A is supported by the two left and right bodies 2A and moves along the axes 2 by means of a suitable drive mechanism 7. Head unit 5 moves to the left or right ideally along a lateral or leftward/rightward axis 1. The position of head unit 5 is controlled by movement of head unit 5 along axis 1 and movement of axis 1 along axes 2. By doing so, adsorption of components is performed by chip mounting nozzles 9 formed in head unit 5.

Figure 2:
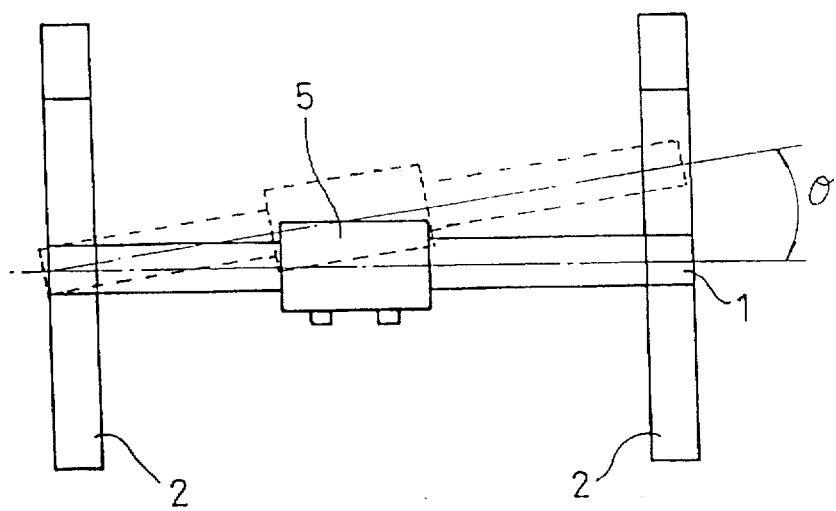
FIG. 2 is a schematic plan view showing an error angle between the forward/backward moving axis and the leftward/rightward moving axis of the orthogonal robot of a chip mounter.

FIG. 2 is a schematic plan view showing an error angle between the forward/backward axes 2 and the actual lateral axis 1' of the body 1A. The actual lateral axis 1' and the axes 2 do not form an accurate right angle, with a result that a small error angle θ is formed due to an installation error. Such an error angle θ is so small that it cannot be visually identified, which requires a precise measurement by a precise measuring apparatus. For the convenience of explanation, error angle θ has been exaggerated in FIG. 2.

Figure 3:
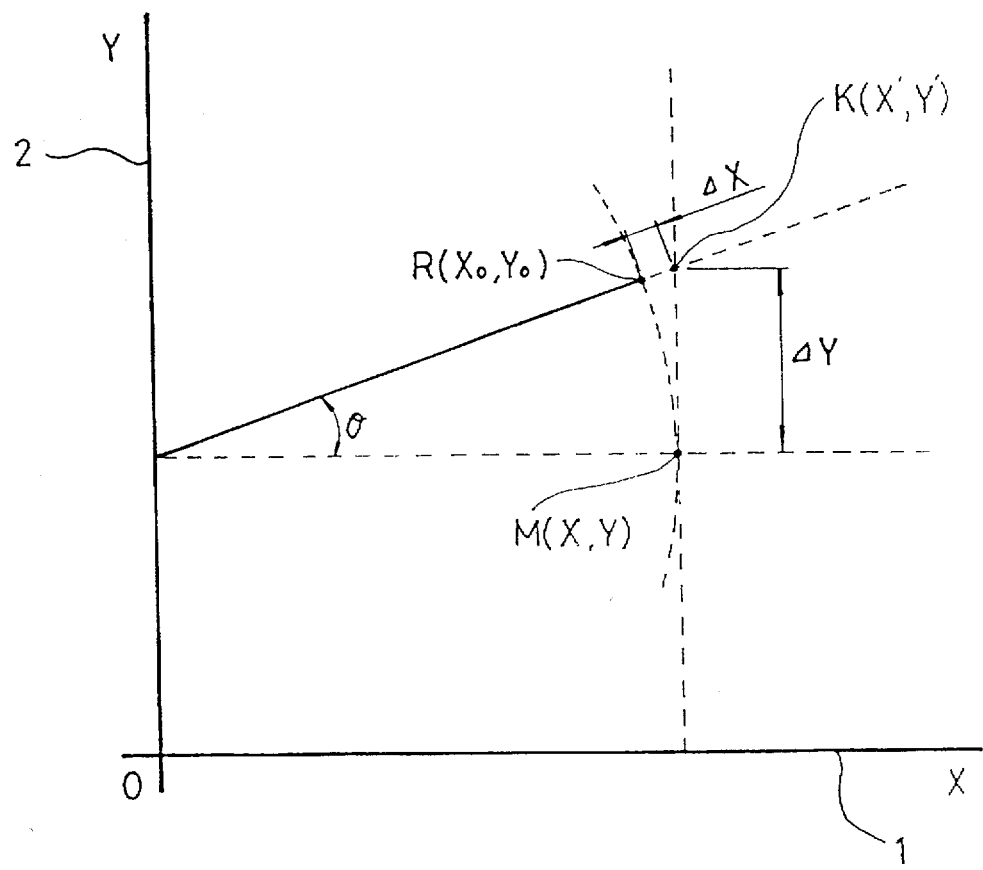
FIG. 3 is a graphical diagram for explaining a position control method according to the present invention.

FIG. 3 is a graphical diagram for explaining a position control method according to the present invention. The axis 1 and each of the axes 2 in the orthogonal robot are represented as an X-axis (lateral axis 1) and Y-axis (forward and backward axes 2) on a graph, respectively. For convenience, an origin O on the graph is determined as a position of head unit 5 which is positioned in a leftmost end of axis 1 and a lowermost end of axes 2. A value of the coordinate represents numerical information with respect to a position of head unit 5.

An input unit (not shown) for inputting a numerical value with respect to the target position on and an operation unit for calculating a corrected or compensating position according to an error angle can be constituted by a microcomputer MC. A position control is performed by a controller C according to information with respect to the corrected position.

Assume that point M is a target position having coordinates (X, Y) along the axes 1, 2 respectively, where head unit 5 is supposed to be positioned. Those target coordinates are input from the input unit and then the robot starts to operate, so that the ends of body 1A move in parallel along bodies 2A while head unit 5 moves along body 1A. In this case, since head unit 5 moves along the body 1A which is tilted by error angle θ, head unit 5 moves upwards by error angle θ. Accordingly, an actual position R is reached having coordinates ($X_o$, $Y_o$), and thus generates an error of ΔX and ΔY when compared with target position M. Therefore, to position head unit 5 in target position M, head unit 5 must be further moved by ΔX along body 1A and moved downwards by ΔY along axes 2. It can be seen from FIG. 3 that X+ΔX=$X^1$. From basic trigonometry, it can be determined that $X^1$=X/ cos θ. Then, it can be seen that if the head unit 5 were moved by αX along the body 1A, it would lie on a point K having the target X coordinate, and a Y" coordinate which is too large by a value αY. Thus, if the body 1A had not initially been moved to the coordinate Y", but rather to some other coordinate Y' equal to Y−αY, then the head unit would now be properly situated at the target coordinates X, Y. However, it can be determined from basic trigonometry that αY=X·tan θ, so Y'=Y−αY=Y−(X·tan θ). Therefore, it will be realized that it is possible to determined, as a function of the error angle θ, a position (first position) of the head unit 5 relative to the body 1A, and a position (second position) of the body 1A relative to the forward/backward axis 2, which would place the heat unit at the target coordinates. In that manner, the first and second positions would constitute compensating positions which compensate for the error angle θ. In this manner, a corrected numerical value is calculated by using a measured error angle O and coordinate value (X, Y) with respect to target position M in the following equations (1) and (2).

$$X'=X/ \cos \theta \quad (1)$$

$$Y'=Y-(X \cdot \tan \theta) \quad (2)$$

Here, X' is a compensating position value on the body 1A in which X' equals X+αX, and Y' is a compensating position value on the forward/backward axis in which Y' equals Y−αY.

By the equations (1) and (2), the compensating position values are calculated without obtaining values of αX and αY separately.

The microcomputer calculates the compensating positions according to a value of measured error angle θ and input target position M, and moves head unit 5 toward the compensating positions. Accordingly, head unit 5 is moved substantially to target position M.

The above-described embodiment shows that a twist of the axis 1' is formed in the upper-right direction. However, the above equations are also applied in the case that the twist of the axis 1' is formed in the lower-right direction. In that latter case, since θ is negative, a substantial value of Y' becomes a value obtained by adding αY to Y. Accordingly, the horizontal axis rises up by αY.

Also, when an origin is not set to a position in which head unit 5 is positioned in the leftmost and bottommost locations, but is set using a predetermined position within a range of movement of head unit 5, it is possible to calculate a corrected position by applying a changed sign of αY in the above equations if head unit 5 moves in the negative direction on 1' according to the signs of each coordinate (X, Y) of target position M.

As described above, the position control method and position control apparatus for chip mounting of the orthogonal robot for a chip mounter, moves a head unit to corrected positions obtained by correcting an error during the position control due to an error angle between the forward/backward axis and the lateral axis, and enables position control toward the target position irrespective of the error angle.

What is claimed is:

1. A method of controlling a position of a chip-mounting robot, the robot comprising a body, and a head unit mounted on the body and including a chip-mounting nozzle; the body being movable along a forward/backward axis; the head unit being movable longitudinally along the body in a direction transversely of the forward/backward axis for positioning the head unit relative to a leftward/rightward axis oriented perpendicularly to the forward/backward axis; the body being slightly inclined relative to the leftward/rightward axis by an error angle; and a drive mechanism for driving the body along the forward/backward axis and for driving the head unit longitudinally along the body; the method comprising the steps of:

A) determining target coordinates for the head unit on the forward/backward axis and the leftward/rightward axis;

B) determining, as a function of the error angle, a first position of the head unit relative to the body, and a second position of the body relative to the forward/backward axis, for placing the head unit at the target coordinates; and C) actuating the drive mechanism to move the head unit and body to the first and second positions, respectively.

2. The method according to claim 1 wherein the step of determining the first position comprises solving the equation X'=X/ cos θ wherein X' is the first position, X is the target coordinate on the leftward/rightward axis, and θ is the error angle; the step of determining the second position comprises solving the equation Y'=Y−(X·tan θ), wherein Y' is the second position, and Y is the target coordinate on the forward/backward axis.

3. A chip-mounting robot, comprising:

a body movable along a forward/backward axis oriented perpendicular to a rightward/leftward axis, a longitudinal axis of the body being slightly inclined relative to the rightward/leftward axis by an error angle;

a head unit mounted on the body and including a chip-mounting nozzle, the head unit being movable longitudinally along the body in a direction transversely of the forward/backward axis for positioning the head unit relative to the leftward/rightward axis;

a drive mechanism for driving the body along the forward/backward axis and for driving the head unit longitudinally along the body; and an operation unit for receiving target data including target coordinates for the head unit on the forward/backward axis and the leftward/rightward axis, respectively, and for determining, as a function of the error angle, a first position of the head unit relative to the body, and a second position of the body relative to the forward/backward axis, for placing the head unit at the target coordinates; and a controller connected to the drive mechanism and the operation unit for actuating the drive mechanism to move the head unit and the body to the first and second positions, respectively.

4. The robot according to claim 3 wherein the operation unit is operable to determine the first position by solving the equation $X'=X \cos \theta$, wherein $X'$ is the first compensating position, $X$ is the target coordinate on the leftward/rightward axis, and $\theta$ is the error angle; the operation unit being further operable to determine the second position by solving the equation $Y'=Y-(X \cdot \tan \theta)$, wherein $Y'$ is the second position, and $Y$ is the target coordinate on the forward/backward axis.

* * * * *